United States Patent [19]

Olsen et al.

[11] 4,092,166

[45] May 30, 1978

[54] DOUBLE EXPOSURE AND DOUBLE ETCH TECHNIQUE FOR PRODUCING PRECISION PARTS FROM CRYSTALLIZABLE PHOTOSENSITIVE GLASS

[75] Inventors: Carlton Edward Olsen, San Jose; Leroy Jasper Serpa, Campbell, both of Calif.

[73] Assignee: International Business Machines Corporation, Armonk, N.Y.

[21] Appl. No.: 754,463

[22] Filed: Dec. 27, 1976

[51] Int. Cl.² .............................................. G03C 5/00
[52] U.S. Cl. ......................................... 96/38.2; 96/36; 156/661
[58] Field of Search ........................... 96/36, 38.2, 34; 156/661

[56] References Cited

U.S. PATENT DOCUMENTS

| | | | |
|---|---|---|---|
| 3,473,927 | 10/1969 | Loose | 96/36 |
| 3,519,522 | 7/1970 | Ference | 96/36 |
| 3,843,394 | 10/1974 | Katayama et al. | 96/36 |

Primary Examiner—Won H. Louie, Jr.
Attorney, Agent, or Firm—Otto Schmid, Jr.

[57] ABSTRACT

A double exposure and double etch technique for producing precision parts from a photosensitive material is described. The process is described in terms of producing an array of ink jet charge electrodes which comprise a series of small through holes on accurately defined centers. The process comprises the steps of exposing the photosensitive material through a mask to develop an undersized through hole and heat treating the photosensitive material to change its characteristics so that an etchable material is produced in the exposed area. The material is then etched to form the undersized through hole which is substantially tapered. The material is then exposed again with a full sized mask including any conductor patterns and the material is again heat treated. The material is again etched and this etching, in the nature of a surface etch, reduces the taper because of the lower etch rate of the unexposed material as compared to the much higher etch rate of the previously unetched tapered material.

12 Claims, 9 Drawing Figures

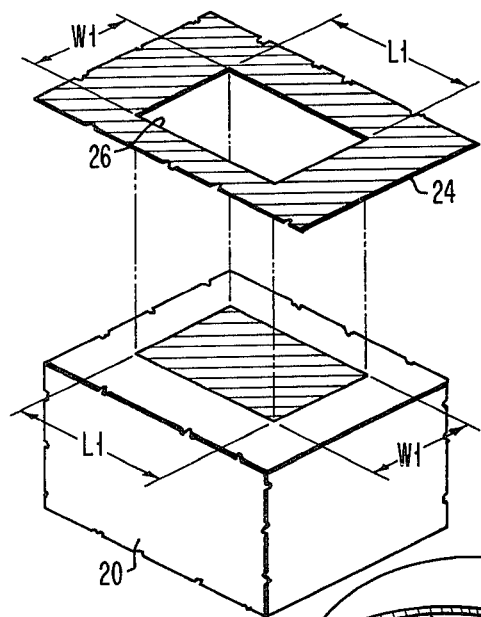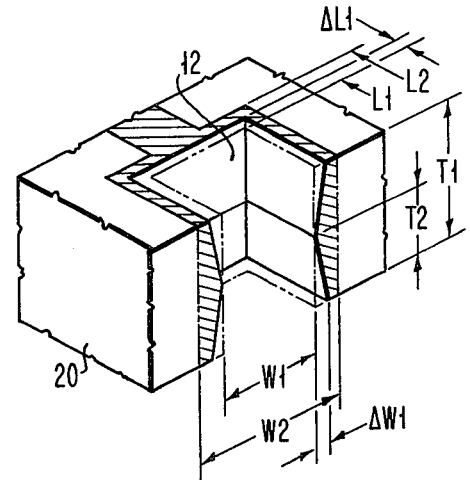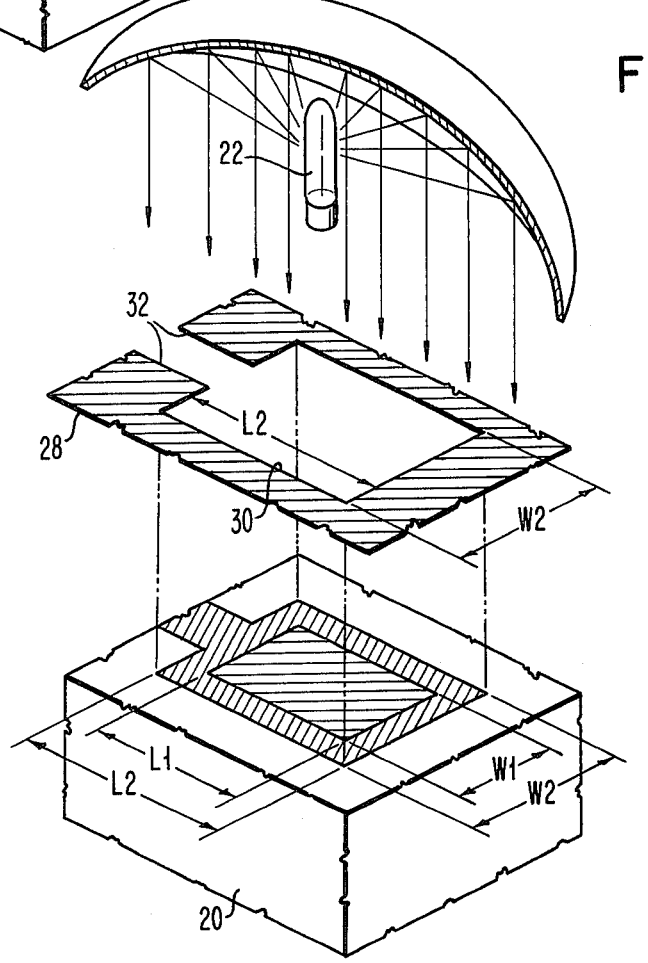
FIG. 1
FIG. 2
FIG. 3

DOUBLE EXPOSURE AND DOUBLE ETCH TECHNIQUE FOR PRODUCING PRECISION PARTS FROM CRYSTALLIZABLE PHOTOSENSITIVE GLASS

CROSS REFERENCE TO RELATED APPLICATION

Multilayer Photosensitive Glass Ceramic Charge plate by C. E. Olsen and L. J. Serpa, Application Ser. No. 754,708 filed Dec. 27, 1976.

BACKGROUND OF THE INVENTION

In the process of manufacturing certain precision apparatus such as an array of ink jet charge electrodes for example, it is desirable to use a single material which is capable of being converted in multiple coexisting phases where these phases have significantly different chemical behavior. One example is the use of photosensitive glass which can be caused to change characteristics when exposed to suitable radiation, giving rise to differential etching properties.

However, conventional techniques are not sufficient to produce items such as an array of ink jet charge electrodes due to the precision size and small spacing required. The taper resulting from a conventional etching process would make the densely packed array of charge electrodes impossible to achieve.

It is therefore the major object of the present invention to provide a process whereby precision apparatus such as an array of ink jet charge electrodes can be made from materials such as photosensitive glass by a novel etching process.

SUMMARY OF THE INVENTION

In accordance with the present invention there is provided a process for producing precision apparatus in a photosensitive material comprising the steps of exposing the photosensitive material through a first mask to produce an undersized pattern in the photosensitive material, heat treating the photosensitive material to a temperature to change the characteristics of the exposed area, exposing the photosensitive material to an etching solution to remove the exposed part of the material, exposing the photosensitive material through a second mask having a full sized pattern therein, heat treating the photosensitive material to a temperature sufficient to change the characteristic of the exposed portion of the material and etching the photosensitive material to remove the exposed part so that a precision component such as a substrate having a series of holes of accurate size and spacing is produced.

BRIEF DESCRIPTION OF THE DRAWINGS

FIG. 1 shows an exploded perspective view of the first exposure step for one charge electrode hole;

FIG. 2 is a perspective view of the charge electrode after completion of the first etching step;

FIG. 3 is an exploded perspective view of the second exposure step for the charge electrode hole;

DESCRIPTION OF THE PREFERRED EMBODIMENT

The process is described in terms of producing an array of ink jet charge electrodes, but it will be recognized be those skilled in the art that the process is applicable to a wide range of applications. The process is also described in terms of the usage of a photosensitive glass material. However, the process is generally valid for any single material which is capable of being converted into multiple coexisting phases where these phases have significantly different chemical behavior.

Figure 6:
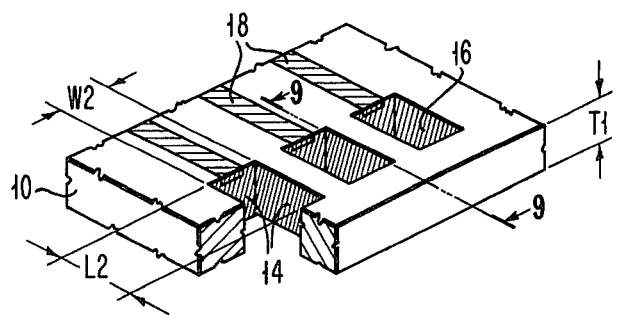
FIG. 6 is a perspective view showing a part of the finished charge electrode.
Figure 7:
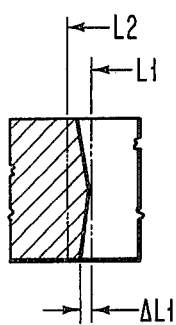
FIG. 7 is a section view along lines 7—7 of FIG. 4.
Figure 8:
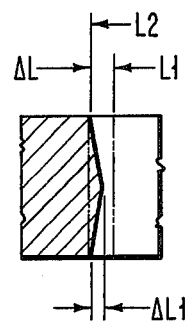
FIG. 8 is a section view showing an intermediate point in the second etching step.
Figure 9:
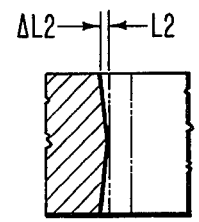
FIG. 9 is a section view along lines 9—9 of FIG. 6.

Referring to FIG. 6 of the drawings, a charge electrode array 10 is shown. The charge electrode comprises a plurality of apertures 12 which extend entirely through the charge electrode for passage of a corresponding plurality of fluid or ink jet streams. Although only a few apertures 12 are shown, a practical device would include a large number such as from 60 to 240. The apertures 12 shown in the drawings are rectangular, but the apertures can have other shapes such as elliptical or round. The interior surfaces of apertures 12 are provided with a conductive surface 14 to produce a plurality of charge tunnels. The plurality of ink jet streams are generated by a fluid jet head and caused to break into streams of uniformly sized drops by well known means (not shown). The charge electrode is positioned a distance away from the nozzle orifices so that the ink jet stream filaments break into the stream of uniform drops within the corresponding charge tunnels 16. The drop may thus be selectively given an electrostatic charge upon breakoff and the charged drops subsequently deflected by an electrostatic deflection field to a gutter, while the uncharged drops continue toward a recording medium for impingement thereon.

Manufacture of the ink jet charge plate as shown in FIG. 6 has proven to be a problem since each of the apertures 12 must be of the same size and the center-to-center spacing of the apertures must also be closely controlled.

The use of a material such as photosensitive glass for the charge electrodes would be desirable since etching processes for such materials are generally well known, and it is known that photosensitive glass can be selectively etched. However, it was found that the taper of the apertures when utilizing a conventional etching technique for the photosensitive glass in some cases is greater than the clearance between adjacent charge tunnels and for this reason the conventional etching technique was inoperable.

Our process minimizes the taper of the through holes so that it is relatively undetectable and therefore produces a process suitable for use in producing precision parts such as the charge electrodes shown in FIG. 6. The process is described by the use of a photosensitive glass substrate material such as that marketed under the trade name of Foto-Ceram by Corning Glass. The first step in the process is to expose the photosensitive glass substrate material to light of a wavelength to which the photosensitive glass substrate material is sensitive and this exposure develops nucleation sites within the glass material for subsequent crystalline growth. The substrate is then heat treated forming a crystalline substance within the exposed areas which is described by Corning as "Foto-Opal." The substrate is then exposed to a suitable etching solution which etches away the Foto-Opal material at a much greater rate than the unexposed material which is described by Corning as "Foto-Form" material. A tapering of the Foto-Form material that forms the boundary of the aperture with the Foto-Opal occurs due to the differential etching rates. The amount of taper is proportional to the depth of etch into the Foto-Opal material and this taper is very significant for deep etched holes such as apertures 12 in charge electrode 10. To minimize the taper in the apertures, a second exposure-etch cycle is utilized to significantly reduce the taper, since it it proportional only to a thin shell of material bounded by the initial etched through hole and a slightly larger exposed finished hole size pattern. An added advantage of the double etch process is that the final etching operation not only produces the finished size for the charge tunnels, but also can be used to etch the conductor lines to the proper depth. The entire substrate is then exposed and subjected to the heat treatment to desensitize the glass.

The order of the process steps can be changed to a certain extent without materially affecting the precision of the process. For example, the second exposure step can be done prior to the first etching step and, in some cases, this order may be preferable since there is less chance of light scattering in the second exposure step which may lessen the resolution of the process.

The substrate 20 may comprise any suitable material, but the preferred material is a photosensitive glass material. The photosensitive glass has as one of its components a polyvalent ion which is easily excited to a higher valence state and this excitation can be accomplished by light from the light source impinging upon the glass. Another component of the glass is a metal ion which easily gives up an electron, thereby reducing the metal ion to form nucleation sites and crystals grow from these nucleation sites to produce the crystalline phase of the glass. A third component of the glass is one which increases the capacity of the glass to hold the other two mentioned components in solution and this component is usually antimony. A suitable substrate is the photosensitive glass sold under the trade name of "Foto-Ceram" by Corning Glass Company.

The specific steps necessary to carry out our process are described below. The first step in the process is to expose the substrate 20 to radiation from a suitable light source through mask 24. The light source preferably comprises a collimated light source. A suitable light source to be used with photosensitive glass is a mercury/xenon light. Mask 24 has a plurality of openings 26 having a size W1 by L1 which represents a smaller area than that of apertures 12 for the finished charge electrode array.

The next step in the process is to heat treat the substrate to transform the glass exposed through the undersize hole pattern to the crystalline phase. This is accomplished by raising the substrate to the critical temperature for that particular glass for a time sufficient for crystallization to be completed. The manufacturer gives sufficient data to determine the critical temperature and the time to produce the desired grain size for the application, and this critical temperature is 592° C for about 30 minutes for Foto-Ceram glass for our application.

The next step in the process is to expose the substrate to a suitable etching solution so that the Foto-Opal glass is etched away at a much faster rate than the Foto-Form glass. A suitable etching solution is a 12% solution of hydrofluoric acid in water. As can be seen in FIG. 2, ΔL1 and ΔW1 are the undercuts that take place in the surrounding Foto-Form boundary, and these quantities, ΔL1 and ΔW1 are proportional to the depth of etch into the Foto-Opal glass.

The substrate is then re-exposed to light source 22 through mask 28 as shown in FIG. 3. As discussed above, the re-exposure may be accomplished prior to the first etching step. Mask 28 has an opening 30 with dimensions W2 by L2 which are the final dimensions of the charge tunnel and an opening 32 to provide the conductor path from the charge tunnel.

The substrate is then subjected to a heat treating step as before to crystallize the glass exposed through mask 28.

The final etching step is then performed, and this etching cycle removes an equal amount of material (ΔL) from the walls of the charge tunnel and conductor line depth. The size of mask 24 can be chosen to match a ΔL requirement for the desired slot depth for the conductor slot 34.

The entire substrate is then exposed to light source 22 and the substrate is then exposed to a heat treating step so that the substrate is then desensitized.

Figure 4:
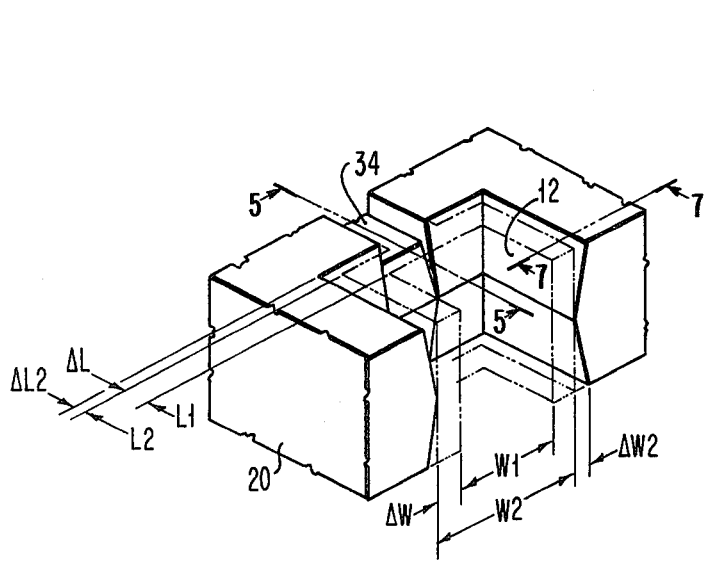
FIG. 4 is a perspective view of the charge electrode hole after completion of the second etching step.
Figure 5:
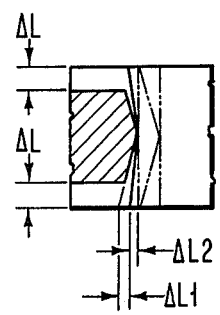
FIG. 5 is a section view along line 5—5 of FIG. 4.

To demonstrate the taper minimization produced by the double etch process, the relative undercuts into the Foto-Form glass from the two etching operations is shown in FIGS. 2 and 4. $(\Delta L1/\Delta L2) = (\Delta L1/\Delta L1/R) = R$ where R is approximately equal to 20. This indicates in effect that undercut from a normal single expose-etch operation is twenty times as great as our proposed double expose-etch process.

There are certain combinations of charge tunnel size and center distances for arrays presently under consideration that would permit only a 2 to 4 mil clearance between adjacent charge tunnels. It can be demonstrated that the taper resulting from a normal single exposure-etch process would make this densely packed combination impossible to achieve. ΔL1 equals taper resulting from a single expose-etch process. ΔL1 equals $T1/2R = 1.25$ mils where $T1$ equals 50 mils (charge electrode thickness), $R = 20$ (differential etch rate). It can be seen that 2.5 mils (2ΔL1) of clearance would be lost due to taper resulting in a possible overlap of adjacent charge tunnels, whereas for the double exposure-etch process, $\Delta 2 = (T1/2R^2) = .0625$ mils. The loss in this case due to taper is relatively undetectable, 0.12 mils (2ΔL2).

Thus, it has been shown that our double expose-etch process is suitable for producing a precision apparatus such as an ink jet charge electrode array which would be impossible to produce using a conventional single exposure-etch process.

While the invention has been particularly shown and described with reference to a preferred embodiment thereof, it will be understood by those skilled in the art that various changes in the form and details may be made therein without departing from the spirit and scope of the invention.

What is claimed is:

1. A process for precision etching a photosensitive glass material comprising the steps of:
    exposing a selectively crystallizable photosensitive glass substrate through a first mask to a source of radiation to which said photosensitive glass is sensitive;
    heat treating said substrate by heating to a temperature sufficient to produce a crystalline phase within the part of the substrate exposed through said first mask to said radiation;

treating the substrate with an etchant to remove the crystalline phase part of said substrate, said treating step producing a taper at the boundary of the crystalline phrase material and the unexposed part of said substrate;

exposing the substrate through a second mask to a source of radiation to which said substrate is sensitive; said second mask having an incrementally larger opening than corresponding openings in said first mask;

heat treating said substrate by heating to a temperature at which the substrate produces a crystalline phase in the area exposed to said radiation; and treating the substrate with an etchant to remove the crystalline phase material to produce a precision etched part having an etched pattern with substantially reduced taper as compared to the taper resulting from said first treating step.

2. The process according to claim 1 in which the exposure step utilizes a source of radiation comprising a mercury/xenon lamp.

3. The process according to claim 2 wherein said heat treating step comprises heating said substrate to a temperature of about 592° C for about 30 minutes.

4. A process for precision etching a photosensitive glass material comprising the steps of:

exposing a selectively crystallizable photosensitive glass substrate through a first mask to a source of radiation to which said photosensitive glass is sensitive;

heat treating said substrate by heating to a temperature sufficient to produce a crystalline phase within the part of the substrate exposed through said first mask to said radiation;

exposing the substrate through a second mask to a source of radiation to which said substrate is sensitive; said second mask having an incrementally larger opening than corresponding openings in said first mask;

treating the substrate with an etchant to remove the crystalline phase part of said substrate, said treating step producing a taper at the boundary of the crystalline phrase material and the unexposed part of said substrate;

heat treating said substrate by heating to a temperature at which the substrate produces a crystalline phase in the area exposed to said radiation; and treating the substrate with an etchant to remove the crystalline phase material to produce a precision etched part having an etched pattern with substantially reduced taper as compared to the taper resulting from said first treating step.

5. The process according to claim 4 in which the exposure step utilizes a source of radiation comprising a mercury/xenon lamp.

6. The process according to claim 5 wherein said heat treating step comprises heating said substrate to a temperature of about 592° C for about 30 minutes.

7. A process for precision etching from a photosensitive glass material an ink jet charge electrode substrate having a plurality of small openings therein comprising the steps of:

exposing a selectively crystallizable photosensitive glass substrate through a first mask defining a plurality of undersize openings to a source of radiation to which said photosensitive glass is sensitive;

heat treating said substrate by heating to a temperature sufficient to produce a crystalline phase within the part of the substrate exposed through said first mask to said radiation;

treating the substrate with an etchant to remove the crystalline phase part of said substrate, said treating step producing a taper at the boundary of the crystalline phrase material and the unexposed part of said substrate;

exposing the substrate through a second mask defining a plurality of full-size openings and a plurality of conductor paths to a source of radiation to which said substrate is sensitive;

heat treating said substrate by heating to a temperature at which the substrate produces a crystalline phase in the area exposed to said radiation; and treating the substrate with an etchant to remove the crystalline phase material to produce a precision etched part having an etched pattern comprising a plurality of conductor slots and a plurality of openings with substantially reduced taper as compared to the taper resulting from said first treating step.

8. The process according to claim 7 in which the exposure step utilizes a source of radiation comprising a mercury/xenon lamp.

9. The process according to claim 8 wherein said heat treating step comprises heating said substrate to a temperature of about 592° C for about 30 minutes.

10. A process for precision etching from a photosensitive glass material an ink jet charge electrode substrate having a plurality of small openings therein comprising the steps of:

exposing a selectively crystallizable photosensitive glass substrate through a first mask defining a plurality of undersize openings to a source of radiation to which said photosensitive glass is sensitive;

heat treating said substrate by heating to a temperature sufficient to produce a crystalline phase within the part of the substrate exposed through said first mask to said radiation;

exposing the substrate through a second mask defining a plurality of full-size openings and a plurality of conductor slots to a source of radiation to which said substrate is sensitive;

treating the substrate with an etchant to remove the crystalline phase part of said substrate, said treating step producing a taper at the boundary of the crystalline phrase material and the unexposed part of said substrate;

heat treating said substrate by heating to a temperature at which the substrate produces a crystalline phase in the area exposed to said radiation; and treating the substrate with an etchant to remove the crystalline phase material to produce a precision etched part having an etched pattern comprising a plurality of conductor slots and a plurality of openings with substantially reduced taper as compared to the taper resulting from said first treating step.

11. The process according to claim 10 in which the exposure step utilizes a source of radiation comprising a mercury/xenon lamp.

12. The process according to claim 11 wherein said heat treating step comprises heating said substrate to a temperature of about 592° C for about 30 minutes.

* * * * *